Jan. 20, 1970 E. D. NIELSEN 3,491,306
DC COUPLED AMPLIFIER WITH AUTOMATIC GAIN CONTROL
Filed Dec. 26, 1967

INVENTOR.
EINER DALE NIELSEN
BY Flehr, Hohbach, Test, Albritton & Herbert
ATTORNEYS United States Patent Office 3,491,306
Patented Jan. 20, 1970

3,491,306

DC COUPLED AMPLIFIER WITH AUTOMATIC GAIN CONTROL

Einer Dale Nielsen, Los Gatos, Calif., assignor to Signetics Corporation, Sunnyvale, Calif., a corporation of California Filed Dec. 26, 1967, Ser. No. 693,359
Int. Cl. H03g 3/30
U.S. Cl. 330—29 4 Claims

ABSTRACT OF THE DISCLOSURE

A DC coupled amplifier with automatic gain control (AGC) including a first stage which acts as a current source and which has as a load a second stage. Both stages include amplifying transistors which have their amplification controlled by variation of the emitter resistance. This is accomplished by varying partially saturated transistors which are controlled by the AGC voltage source that shunts the normal emitter resistances. The resultant variation of the input impedance of the second stage compensates for a change in transconductance of the first stage to thus maintain the input impedance and gain of the first stage constant. In addition, the resultant gain of the two stages provides a final combined characteristic having a constant frequency bandwidth over the range of AGC voltages.

Background of the invention

The present invention is directed to an amplifier with automatic gain control and more specifically to a DC coupled amplifier suitable for use in integrated circuitry.

In the design of circuits which are to be integrated in a semiconductive substrate, the inherent limitations of such integration must be considered. For example, because of the difficulty of forming large value capacitors it is preferred that integrated circuitry be direct or DC coupled.

However with direct coupling there arises concomitant problems of D.C. voltage variations occurring with changes in the gain levels of the integrated circuits. These problems are aggravated when the circuit includes automatic gain control (hereinafter termed "AGC").

Summary of the invention and objects

It is therefore a general object of the invention to provide an improved DC coupled amplifier with automatic gain control.

It is another object of the invention to provide an amplifier of the above type having a constant input impedance with changes in AGC voltage.

It is another object of the invention to provide an amplifier as above having a constant frequency bandwidth with changes in AGC voltage.

In accordance with the above objects there is provided a DC coupled amplifier with automatic gain control (AGC) comprising AGC means for providing an AGC voltage and first and second amplifying stages coupled to each other and said AGC means. The input impedance of the second stage serves as a load for the first stage. The first stage includes an amplifier having a voltage gain proportional to changes in the AGC voltage and also proportional to changes in the input impedance of the second stage. The first stage has an input impedance which is a function of the voltage gain of the first stage. The second amplifying stage has an input impedance inversely proportional to its gain, such gain in turn being proportional to the AGC voltage in the same manner as the first amplifier so that the input impedance of the second stage varies to compensate for changes in current gain in the first stage caused by variation of the AGC voltage. This maintains the voltage gain of the first stage constant with changing values of AGC voltage. Thus the input impedance of the first stage is substantially constant and the combined gain characteristic of the first and second stages is a family of curves with AGC voltage as a parameter having a substantially constant frequency bandwidth.

Description of the preferred embodiment

Figure 1:
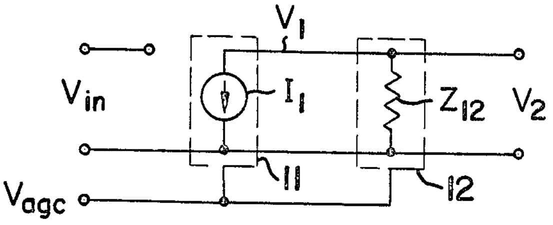
FIGURE 1 is an equivalent circuit, embodying the present invention.
Figure 2:
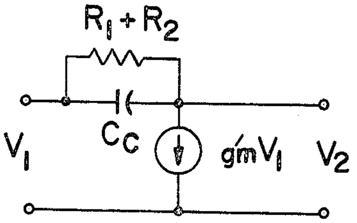
FIGURE 2 is an equivalent circuit of a portion of FIGURE 1.

Referring now to both FIGURES 1 and 2, the amplifier of the present invention includes a first amplifying stage 11 coupled to a second amplifying stage 12 which are indicated by the dashed blocks. Stage 11 is a current source producing current $I_1$ at a voltage of $V_1$ as also indicated. The second amplifying stage 12 is represented in FIGURE 1 as a load $Z_{12}$ to the first stage 11. AGC means for automatic gain control is provided from a voltage terminal labelled $V_{AGC}$. This voltage is coupled to both amplifying stages 11 and 12. FIGURE 2 is an equivalent circuit of stage 12.

Figure 3:
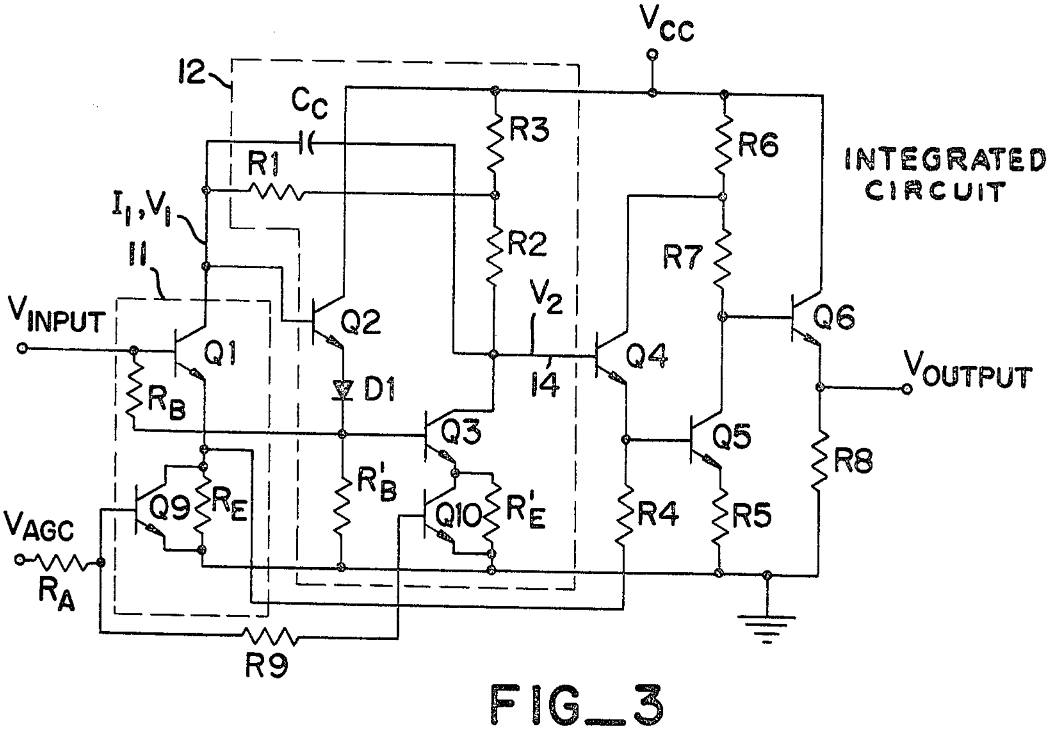
FIGURE 3 is a detailed schematic which includes the circuit of FIGURE 1.

The detailed schematic of stages 11 and 12 is shown in FIGURE 3 where the input voltage to amplifier 11 is applied at the $V_{input}$ terminal to the base of the transistor Q1. The base terminal of transistor Q1 is biased through a resistor $R_B$ which in turn is coupled to ground through second resistor $R'_B$. The emitter of transistor Q1 is coupled to ground through a series connected resistor $R_E$. This resistor is shunted by the collector-emitter terminals of a transistor Q9 which has an input to its base the $V_{AGC}$ voltage. This voltage is applied to the base of Q9 through a series connected resistor $R_A$.

The collector terminal of transistor Q1 is coupled to a steady state power supply voltage $V_{cc}$ through series connected resistors R1 and R3 and in addition into the base of an emitter follower transistor Q2. The collector of Q2 is supplied from $V_{cc}$ and the emitter is coupled to ground through a series connected diode D1 and resistor $R'_B$.

Gain for stage 12 is provided by transistor Q3 which has as a base input the emitter output from transistor Q2. The collector of Q3 is coupled to $V_{cc}$ through series connected resistors R2 and R3. The emitter of Q3 is coupled to ground through a resistor $R'_E$ which is shunted by a transistor Q10 in the same manner as the emitter of Q1. Transistor Q10 has a base input $V_{AGC}$ which is coupled to it through series connected resistors $R_A$ and R9. The output of the second stage occurs on line 14 from the collector of Q3.

The emitter output of Q4 is feed back to transistor Q1 through series connected resistor R4. This decreases gain somewhat and increases the overall linearity of the circuit. The total resistance, $R^*_E$, shunting Q9 is the effective sum of $R_E$ and R4.

All of the components shown in FIGURE 2 are formed on a common semiconductive substrate to form an integrated circuit. Because of the DC coupling, no large value capacitors are necessary.

Operation

The AGC portion of the circuit includes transistors Q9 and Q10 and resistors $R^*_E$ and $R'_E$ which are shunted across Q9 and Q10. The two transistors form in effect a variable resistance in series with the saturation voltage drop across the transistor. Thus, this provides a variable resistor in shunt across resistors $R^*_E$ and $R'_E$. More specifically, as $V_{AGC}$ is raised in magnitude, transistors Q9 and Q10 become partially saturated. The effective fixed resistance which is seen at the emitters of Q1 and Q3 is reduced increasing the gain of these transistors. This is true since the emitter resistance $R^*_E$ and $R'_E$ in combination with the internal emitter resistance, $r_e$, is inversely proportional to transconductance $g_m$.

$$r_e(Q1)+R^*_E=1/g_m \quad (1)$$

$$r_e(Q3)+R'_E=1/g_m' \quad (1a)$$

where $g_m$ is the transconductance of Q1 and $g_m'$ the transconductance of Q3. The gain of a transistor is proportional to the product of transconductance and the load, R, on the transistor:

$$\text{GAIN}=-g_mR \quad (2)$$

In addition to regulating the gain of transistors Q1 and Q3, the AGC transistors Q9 and Q10 also provide an offset voltage of, for example, 100 millivolts when in saturation to keep the DC operating level of the transistor centered. Thus, transistors Q9 and Q10 are equivalent to a variable resistance in series with an unipotential 100 millivolt source. Therefore, although the equivalent parallel resistance at the emitters of Q9 and Q10 is reduced, the offset voltage of the transistors Q9 and Q10 maintain the DC level constant.

In accordance with the invention, to maintain the input impedance of the $V_{input}$ terminal substantially constant with changing values of $V_{AGC}$, the gain of the first stage 11 must be relatively constant since $$Z_{in}=\frac{R_B}{1-\frac{-V_1}{V_{in}}} \quad (3)$$

where $Z_{in}$ is the input impedance at terminal, $V_{input}$, $R_B$ is the resistor at the base of Q1 and $V_1/V_{in}$ the gain of stage 11. Referring to FIGURE 1 the gain of Q1 is $$V_1/V_{in}=g_mZ_{12} \quad (4)$$

where $g_m$ is the transconductance of transistor Q1 and $Z_{12}$ the input impedance of the second stage 12 which acts as a load across the emitter and collector of Q1.

Thus to maintain a constant gain for the first stage 11, $g_m$ and $Z_{12}$ must be varied in opposite directions and at the same rate. Referring to FIGURE 2, the gain of stage 12 is, $$V_2/V_1=1-g'_mZ_{L12} \quad (5)$$

and the input impedance is, $$Z_{12}=\frac{Z_{L12}}{[1-V_2/V_1]} \quad (6)$$

where $$Z_{L12}=\frac{R_1+R_2}{1+j\omega Cc(R_1+R_2)} \quad (7)$$

Combining Equations 5 and 6 yields, $$Z_{12}=1/g'_m \quad (8)$$

Substituting, Equation 8 in Equation 4 gives, $$V_1/V_{in}=-g_m/g'_m \quad (9)$$

But referring to Equations 1 and 1*a*, to maintain $Z_{in}$ constant the variation of total effective emitter resistances must take place at the same rate. This is achieved by the matching of transistors Q9 and Q10 and letting $R^*_E$ equal $R'_E$. Thus $g_m$ will equal $g'_m$ and Equation 9 produces, $$V_1/V_{in}=-1 \quad (10)$$

Substituting, Equation 10 in Equation 3 gives, $$Z_{in}\frac{R_B}{1-\frac{V_1}{V_{in}}}=\frac{R_B}{2} \quad (11)$$

Thus, in summary, the input impedance $Z_{in}$ of Q1 is held constant by maintaining the gain, $V_1/V_{in}$, constant. Since $V_1/V_{in}$ is proportional to the product $g_mZ_{12}$, $Z_{12}$ varies in an equal and opposite manner to the $g_m$ of Q1 and provides a constant impedance with changing values of the AGC control voltage. Such an impedance characteristic is especially desirable when a signal source is sensitive to loading or is critically tuned.

In accordance with the present invention, as illustrated in FIGURE 3, the frequency bandwidth, $f_o$, is maintained constant with changes in $V_{AGC}$. The overall gain, $V_{out}/V_{in}$ equation may be found by combining Equations 5 and 9 as, $$V_1/V_{in}\times V_2/V_1=-g_m/g'_m(1-g'_mZ_{L12})=-g_mZ_{L12} \quad (12)$$

assuming $g'_mZ_{L12}$ is much greater than 1.

Figure 4:
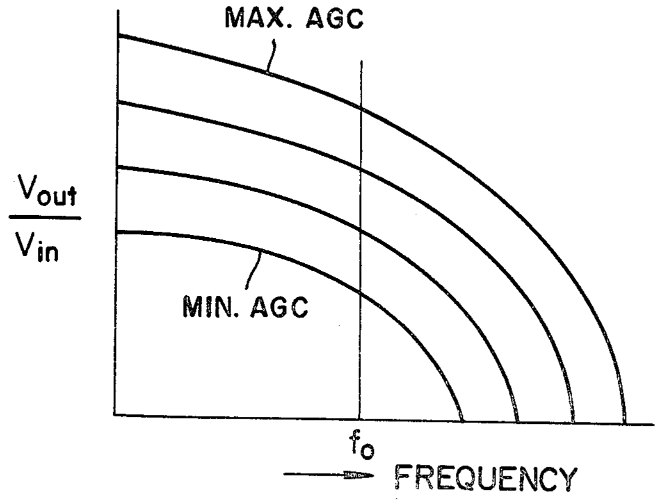
FIGURE 4 shows characteristic curves useful in understanding the present invention.

Equation 12 represents the family of curves of FIGURE 4 since $Z_{L12}$ is purely frequency dependent and $g_m$ is a function only of $V_{AGC}$ (see Equation 1).

Thus, the present invention provides a DC coupled integrated type amplifier with constant input impedance and characteristic curves which exhibit a constant bandwidth over the range of AGC voltages.

I claim:

1. A DC coupled amplifier with automatic gain control, AGC, comprising, AGC means for providing an AGC voltage, first and second amplifying stages coupled to each other and said AGC means, said second stage having a predetermined input impedance, means for coupling the input of said second stage across the output terminals of said first stage, said second stage serving as a load for said first stage, said first stage including an amplifier having a voltage gain proportional to changes in said input impedance of said second stage, said first stage including means coupled to said amplifier and responsive to said AGC voltage for varying said voltage gain in a predetermined proportion with respect to changes in said AGC voltage said amplifier having an input impedance which is a function of said voltage gain, said second amplifying stage having an input impedance inversely proportional to its gain, said second stage including means responsive to said AGC voltage for varying said voltage gain of said second stage in said predetermined proportion whereby said input impedance of said second stage varies in the same proportion as said gain of said amplifier due to changes in said AGC voltage to maintain the gain of said first stage constant with changing values of AGC voltage, whereby the impedance of said first stage is substantially constant with changes in said AGC voltage, and whereby said combined gain characteristic of said first and second stages is a family of curves with the AGC voltage as a parameter having a substantially constant frequency bandwidth.

2. A DC coupled amplifier as in claim 1 where said AGC responsive means includes in each of said amplifying stages a resistor shunted by the emitter and collector terminals of a transistor, the effective impedance of such parallel combination being varied by changes in said AGC voltage.

3. A DC coupled amplifier as in claim 2 in which said first and second amplifying stages include transistor amplifiers and in which said parallel combination of resistor and transistor is included in the emitter circuits of said transistor amplifiers.

4. A DC coupled amplifier as in claim 1 in which substantially all components are formed on a common semiconductive substrate to form an integrated circuit.

References Cited

UNITED STATES PATENTS

| | | | |
|---|---|---|---|
| 3,019,396 | 1/1962 | Heine et al. | 330—29 X |
| 3,210,683 | 10/1965 | Pay | 330—71 |
| 3,267,388 | 8/1966 | Finkey et al. | 330—29 X |

OTHER REFERENCES

"IC RF-IF Amplifier," The Electronic Engineer, April 1967, p. 117.

ROY LAKE, Primary Examiner

J. B. MULLINS, Assistant Examiner

U.S. Cl. X.R.

330—19, 145, 28